(12) United States Patent
Perndl et al.

(10) Patent No.: US 10,193,639 B2
(45) Date of Patent: Jan. 29, 2019

(54) OVER THE AIR MEASUREMENT MODULE (71) Applicant: Rohde & Schwarz GmbH & Co. KG, Munich (DE)

(72) Inventors: Werner Perndl, Zorneding (DE); Markus Gallhauser, Freising (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 25 days.

(21) Appl. No.: 15/296,407

(22) Filed: Oct. 18, 2016

(65) Prior Publication Data
US 2017/0222737 A1 Aug. 3, 2017

(30) Foreign Application Priority Data

Jan. 29, 2016 (EP) .................................... 16153360

(51) Int. Cl.
*G01R 29/10* (2006.01)
*H04B 17/10* (2015.01)
*H01Q 9/28* (2006.01)
*H01Q 3/26* (2006.01)
*H01Q 3/04* (2006.01)

(52) U.S. Cl.
CPC ............. *H04B 17/103* (2015.01); *H01Q 3/04* (2013.01); *H01Q 3/267* (2013.01); *H01Q 9/285* (2013.01)

(58) Field of Classification Search
CPC ........................... G01R 29/0878; G01R 29/10
See application file for complete search history.

(56) References Cited

U.S. PATENT DOCUMENTS

2011/0125429 A1 5/2011 Kazama et al.
2015/0035707 A1 2/2015 Tankielun

FOREIGN PATENT DOCUMENTS

FR  2976146 A1  12/2012
JP  2009115644 A  5/2009

OTHER PUBLICATIONS

European Office Action for related European Patent Application No. 16153360.9-1568 dated Jul. 12, 2016, 6 Pages.

*Primary Examiner* — Graham Smith
(74) *Attorney, Agent, or Firm* — Ditthavong & Steiner, P.C.

(57) ABSTRACT

An over the aft measurement module comprises an antenna, adapted to receive a first measuring signal from a device under test or adapted to transmit a second measuring signal to the device under test. Furthermore, the over the air measurement module comprises a mixer, directly connected to said antenna, adapted to reduce or increase a frequency of the received first measuring signal, resulting in a frequency reduced or increased first measuring signal, or adapted to increase or reduce a frequency of a frequency reduced or increased second measuring signal, resulting in the second measuring signal. In addition to this, the over the air measurement module comprises a first connector, connected to said mixer, adapted to input a local oscillator signal into the mixer for frequency conversion.

17 Claims, 5 Drawing Sheets

OVER THE AIR MEASUREMENT MODULE

PRIORITY

This application is a Continuation-In-Part of U.S. application Ser. No. 15/175,197, filed on Jun. 7, 2016 and claims priority of European patent application EP 16 153 360.9 filed on Jan. 29, 2016, which are incorporated by reference herewith.

FIELD OF THE INVENTION

The invention relates to an over the air measurement module for measuring high frequency signals, especially communication signals over the air.

BACKGROUND OF THE INVENTION

During recent years, radio frequencies employed for performing communication tasks have continually risen. Especially with frequencies exceeding many GHz, new problems regarding the measurement of respective signals arise. By connecting the signal source to a measuring device using a cable connection, the behavior of the device under test is influenced.

For example the document US 2015/0035707 A1 shows a slot line antenna on a printed circuit board. The antenna shown there is capable of receiving high frequency signals.

There arises the need of providing measuring means for measuring high frequency signals with a high accuracy and a small size and hardware effort.

SUMMARY OF THE INVENTION

According to a first aspect of the invention, an over the air measurement module is provided. The over the air measurement module comprises an antenna, which is adapted to receive a first measuring signal from a device under test or adapted to transmit a second measuring signal to the device under test. Moreover, the over the air measurement module comprises a mixer which is directly connected to said antenna and is adapted to reduce or increase a frequency of the received first measuring signal, resulting in a frequency reduced or increased first measuring signal, or is adapted to increase or reduce a frequency of a frequency reduced or increased second measuring signal, resulting in the second measuring signal. Furthermore, the over the air measurement module comprises a first connector, connected to said mixer, which is adapted to input a local oscillator signal into the mixer for frequency conversion.

According to a preferred implementation form of the first aspect, the over the air measurement module further comprises a second connector, connected to the mixer, adapted to output the frequency reduced or increased first measuring signal or a corresponding intermediate frequency signal. It is thereby possible, on the one hand, to acquire a measuring signal of an extremely high frequency without altering it and to provide a lower frequency measuring signal to further measuring devices, and on the other hand, to provide a measuring signal of extremely high frequency to the device under test in a controlled manner without influencing the measuring results.

According to a preferred implementation form of the first aspect, the mixer is based on monolithic microwave integrated circuit technology, or the mixer is a harmonic mixer or a mixer comprising a multiplier for the local oscillator signal.

According to a preferred implementation form of the first aspect, a frequency of the local oscillator signal is divided by a factor before inputting the local oscillator signal into the mixer.

According to a preferred implementation form of the first aspect, the over the air measurement module is mounted within a shielded box. It is thereby possible to avoid interference, and thus to guarantee highly accurate measurements.

According to a preferred implementation form of the first aspect, at least one of a frequency of the local oscillator signal and a frequency of the intermediate frequency signal is within a frequency range from 1 GHz to 10 GHz.

According to a preferred implementation form of the first aspect, the over the air measurement module further comprises a power sensor, adapted to measure at least one of the power of the frequency reduced or increased first measuring signal or the power of the second measuring signal.

According to a preferred implementation form of the first aspect, the antenna is a planar antenna. A main radiation direction of the antenna is in the plane of the planar antenna. It is thereby possible to achieve a very low size of the over the air measurement module.

According to a further preferred development of this implementation form, at least some surfaces, advantageously all surfaces of the measuring module facing in the main radiation direction of the antenna are adapted to absorb electromagnetic radiation and do not reflect electromagnetic radiation. Thereby, reflections towards the device under test are prevented. This increases the measuring accuracy.

According to a further preferred implementation form, at least some surfaces, advantageously all surfaces of the measuring device facing in the main radiation direction of the antenna are coated with a paint absorbing electromagnetic radiation and/or covered with absorber material absorbing electromagnetic radiation and/or fabricated from absorber material absorbing electromagnetic radiation. It is thereby possible to further reduce reflections towards the device under test thereby increasing the measuring accuracy.

According to a further preferred implementation form of the first aspect, the over the air measurement module is tapered towards the main radiation direction of the antenna. First of all, this measure also reduces reflections towards the device under test, thereby increasing measuring accuracy. Also, this measure allows for an especially small foot print of the over the air measurement module. This increases the flexibility of use.

According to a further preferred implementation form of the first aspect, at least one of the first connector or the second connector is a coaxial connector allowing to output the intermediate frequency signal to external units or to input a user-defined external local oscillator signal.

According to a further preferred implementation form of the first aspect, a relative power loss for mixing is less than 10 percent, preferably less than 5 percent, most preferably less than 1 percent. In other words, the relative power loss for mixing means the power loss occurring within the mixer due to non-ideal components of the mixer.

According to a further preferred implementation form of the first aspect, the over the air measurement module comprises a substrate, advantageously a printed circuit board. The antenna and the analog signal processor are arranged on the substrate. The antenna is planar with the substrate. The main radiation direction of the antenna is towards an edge of the substrate. It is thereby possible to achieve an extremely small size and low footprint of the over the air measurement module.

According to a further preferred implementation form of the first aspect, the mixer is ring mixer or the mixer comprises at least four diodes.

According to a further preferred implementation form of the first aspect, the antenna is a tapered slot line antenna, advantageously a Vivaldi antenna. It is thereby possible, to achieve satisfactory high frequency characteristics, while achieving a very small size of the antenna.

According to a further preferred development form of the previous implementation form, the substrate comprises an opening between conductors of the tapered slot line antenna. Additionally or alternatively, a substrate bridge connects opposite parts of the tapered slot line antenna in an area of an antenna aperture. A very stable construction of the antenna with beneficial radio frequency characteristics is thereby achieved.

According to a second aspect of the invention, a measuring system comprising a previously described over the air measurement module is provided. The measuring system comprises a measuring device. The measuring device is adapted to receive and measure the frequency reduced first measuring signal from the over the air measurement module. Alternatively or additionally, the measuring device is adapted to provide the frequency reduced second measuring signal to the over the air measurement module. A very flexible and accurate measurement is thereby possible.

BRIEF DESCRIPTION OF THE DRAWINGS

Exemplary embodiments of the invention are now further explained with respect to the drawings, by way of example only. The invention is, however, not limited to these embodiments. In the drawings.

DETAILED DESCRIPTION OF THE DRAWINGS

Figure 1:
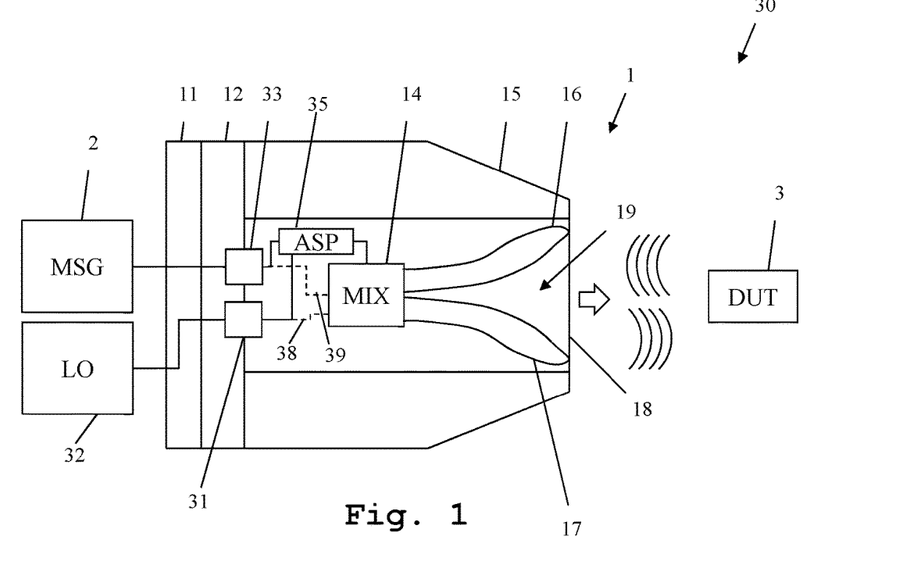
FIG. 1 shows a system with a first embodiment of the over the air measurement module and a measuring to device of the invention in a top-down view.
Figure 2:
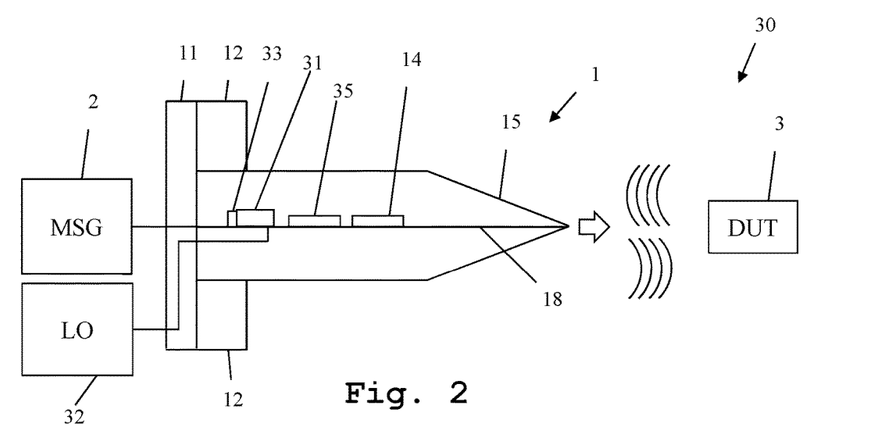
FIG. 2 shows the first embodiment of the over the air measurement module of the invention in a side-view.
Figure 3:
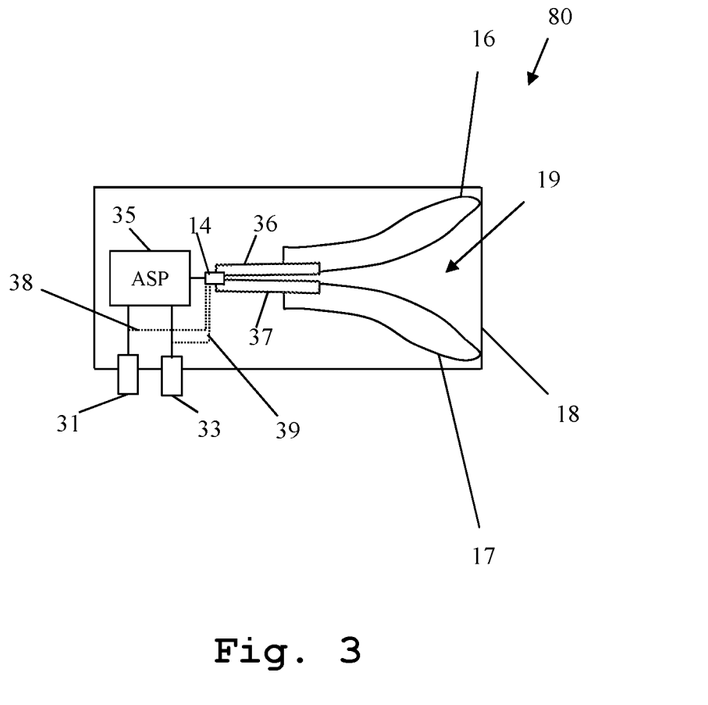
FIG. 3 shows an exemplary embodiment of a schematic circuit board of the over the air measurement module.

First we demonstrate the general construction and function of an over the air measurement module along FIG. 1, FIG. 2, and FIG. 3. Along FIG. 4 and FIG. 5 further details of another implementation form are described. Finally, according to FIG. 6 and FIG. 7, an exemplary embodiment of a mixer and an exemplary embodiment of a monolithic microwave integrated circuit frequency divider, each employed for the over the air measurement module, are described. Similar entities and reference numbers in different figures have been partially omitted.

In FIG. 1, a first embodiment of the over the air measurement module 1 according to the first aspect of the invention is shown. The over the air measurement module 1 comprises a housing 15 which contains a substrate 18, advantageously a printed circuit board. On the substrate 18, two antenna elements 16, 17 forming a tapered slot line antenna 19, are arranged. The antenna 19 is connected to a mixer 14 which is also arranged on the substrate 18. The mixer 14 moreover is connected to an analog signal processor 35 connected to a first connector 31 and a second connector 33. Additionally or alternatively, the mixer 14 is directly connected to said first connector 31 and said second connector 33 via connections 38 and 39.

Connectable to the first connector 31 is a local oscillator 32, which is not part of the over the air measurement module 1, for providing a local oscillator signal for the mixer 14. Additionally, the frequency of the local oscillator signal may be divided by a factor with the aid of a frequency divider before directly or indirectly inputting the local oscillator signal into the mixer 14. Analogously, connectable to the second connector 33 is a measuring device 2, which is likewise not part of the over the air measurement module 1. Preferably, at least one of the first connector 31 and the second connector 33 is a coaxial connector. Furthermore, the antenna 19 has a main radiation direction towards the right edge of the substrate 18, indicated by an arrow in the figures. A device under test 3 is suitably arranged in this direction.

In order to minimize reflections from the over the air measurement module 1, the housing 15 is tapered towards the main radiation direction of the antenna 19. This tapering reduces the effective surface area, which can produce reflections. In order to further reduce such reflections, the housing 15 can be fabricated from an electromagnetic radiation absorbing material. It can also be covered with such a material or can be coated with an absorptive paint. The housing 15 furthermore comprises a back plate 11, which is covered with absorptive material 12 in order to further reduce reflections.

The over the air measurement module 1 is suitable for two types of measurements. In a first type of measurement, a first measuring signal emitted from the device under test 3 is received by the antenna 19 and handed to the mixer 14. The mixer 14 typically reduces, or alternatively increases, the frequency of the first measuring signal resulting in a frequency reduced, respectively increased, first measuring signal. This is done by down-converting, respectively up-converting, the first measuring signal with the aid of the mixer 14. In this context, if the frequency reduced, respectively increased, first measuring signal is not directly passed to the connectors 31 and 33, respectively the signal is passed through the analog signal processor 35, it should be mentioned that the analog signal processor 35 may comprise one or more filters for filtering the frequency reduced, respectively increased, first measuring signal, a power sensor, which can be used for directly measuring a power of the frequency reduced, respectively increased, first measuring signal, an amplifier for amplifying the first frequency reduced, respectively increased, measuring signal, and a radio frequency switch for switching between the previously described measuring option and the measuring option described in the following.

The processed frequency reduced, respectively increased, measuring signal is then handed on to the second connector 33, which passes on the signal to for example an external measuring device 2 for further processing the frequency reduced, respectively increased, measuring signal.

Alternatively, the over the air measurement module can be used for another type of measurement. In this case, the second connector 33 receives a typically frequency reduced, alternatively a frequency increased, second measuring signal from the measuring device 2. It is handed on to the mixer 14.

The mixer 14 increases, respectively reduces, the frequency of the frequency reduced, respectively increased, second measuring signal resulting in a second measuring signal. This is done by mixing the frequency reduced, respectively increased, second measuring signal with the local oscillator signal provided at the first connector 31 with the aid of the mixer 14.

The second measuring signal is then transmitted by the antenna 19 to the device under test 3. By analogy with the explanations mentioned above, the analog signal processor 35 may comprise additional components. The analog signal processor 35 can comprise a filter, for filtering the second measuring signal and/or the second frequency reduced, respectively increased, measuring signal. Also, the analog signal processor 35 can comprise an amplifier for amplifying the second measuring signal and/or the second frequency reduced, respectively increased, measuring signal. Moreover, the analog signal processor 35 can comprise a radio frequency switch, adapted to switch between different operating modes of the over the air measurement module 1.

With respect to each type of operation, the second connector 33 is adapted to output the frequency reduced, respectively increased, signal or a corresponding intermediate frequency signal.

Also here, the measurement system 30 according to the second aspect of the invention is depicted. The measuring system 30 comprises the over the air measurement module 1 and the measuring device 2. The measuring device 2 is adapted to receive and measure the frequency reduced, respectively increased, first measuring signal and/or to provide the frequency reduced, respectively increased, second measuring signal to be transmitted to the device under test 3 as second measuring signal. In addition to this, the system 30 comprises a local oscillator 32 adapted to provide a local oscillator signal for the mixer 14 for the respective frequency conversion.

In FIG. 2 the over the air measurement module of FIG. 1 is shown in a cut view from the side. Here it can be seen that the analog signal processor 14 and the first connector 31 and the second connector 33 are arranged on the substrate 18. Moreover, the tapering of the housing 15 and the arrangement of the absorbers 12 can be seen.

Now, with respect to FIG. 3, an exemplary embodiment of a schematic circuit board 80 of the over the air measurement module 1 is shown. As already mentioned above, on the substrate 18, the two antenna elements 16, 17 forming a tapered slot line antenna 19, are arranged. In order to ensure a highly accurate signal transition between the antenna 19 and the mixer 14, bridging elements 36 and 37 are used. In this manner, an optimal transition between signals of a slotline and signals of a coplanar waveguide is guaranteed.

Furthermore, the mixer 14 is connected to the analog signal processor 35 which is connected to the first connector 31, which is adapted to input a local oscillator signal of the local oscillator 32 directly into the mixer 14 with the aid of connection 38 or indirectly into the mixer 14 via the analog signal processor 35. In addition to this, the analog signal processor 35 is connected to the second connector 33, which is adapted to output the frequency reduced, respectively increased, measuring signal or a corresponding intermediate frequency signal to the measuring device 2. Additionally or alternatively, the second connector 33 may be directly connected to the mixer 14 in order to output the frequency reduced, respectively increased, measuring signal or a corresponding intermediate frequency signal to the measuring device 2 without the aid of the analog signal processor 35.

Figure 4:
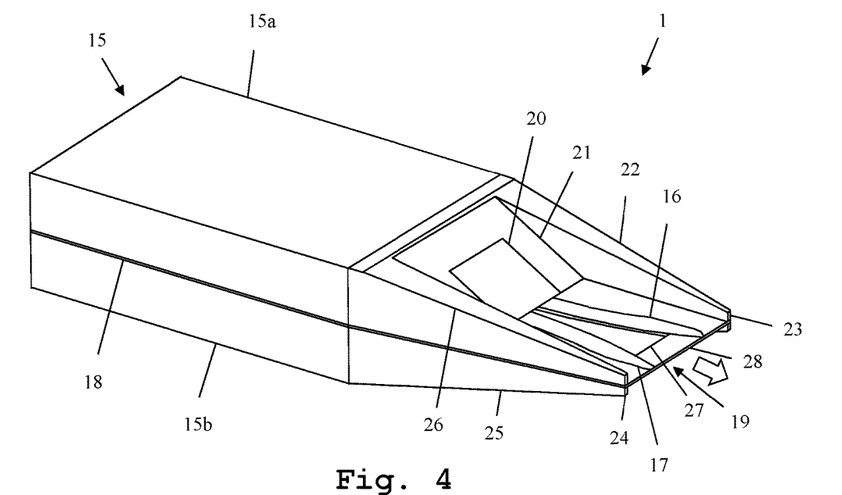
FIG. 4 shows a second embodiment of the over the air measurement module of the invention in a three-dimensional view.

In FIG. 4 a second embodiment of the over the air measurement module 1 is shown. Here, a three-dimensional view of the over the air measurement module 1 is depicted. The housing 15 comprises a first part 15a and a second part 15b. The two housing parts surround the substrate 18 and hold the substrate 18 between themselves. The substrate 18 comprises an opening 27 between the antenna elements 16 and 17. This opening 27 further reduces the influence of the substrate material on the received or transmitted signal. For reasons of stability, the embodiment shown here comprises a substrate bridge 28 connecting opposite parts of the tapered slot line antenna in the area of the antenna aperture.

Moreover, the over the air measurement module 1 comprises an absorber 20, which is arranged surrounding the substrate 18 at the narrow end of the tapered slot line antenna 19. The absorber 20 prevents reflections towards the device under test 2.

Moreover, in this embodiment, the geometric shape of the over the air measurement module 1 is evident. Especially, it is evident here, that the over the air measurement module 1 is tapered towards the main radiation direction of the antenna 19. Moreover, it is evident that all surfaces of the over the air measurement module 1 facing the main radiation direction of the antenna 19 are angled away from a normal of the main radiation direction of the antenna 19. This leads to an especially low reflectivity for signals emitted by the device under test 2. Here, only the very small surfaces 23, 24 point towards the device under test. All other surfaces 21, 22, 25, 26 are angled away from the device under test.

Especially, at least 50%, preferably at least 80%, most preferably all surfaces of the over the air measurement module facing the main radiation direction of the antenna are therefore angled away from a normal of the main radiation direction of the antenna by at least 30°, preferably by at least 45°, most preferably by at least 60°.

In order to further reduce the effect of the substrate 18 on the received or transmitted signal, the relative permittivity $\varepsilon_r$ is low. Especially, it is lower than 4, preferably $\varepsilon_r<2$, most preferably $\varepsilon_r<1.5$. For the same reason, the relative permeability $\mu_r$ is low. Advantageously it is below 3, preferably $\mu_r<2$, most preferably $\mu_r<1.5$.

Figure 5:
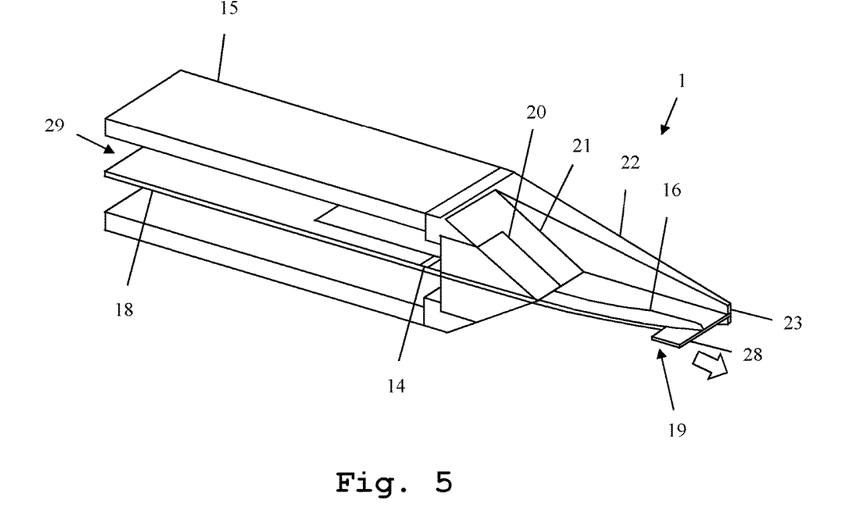
FIG. 5 shows the second embodiment of the over the air measurement module of the invention in a cut-view.

In FIG. 5 a cut open view of the embodiment of FIG. 4 is shown. Here it is evident that the housing 15 comprises an opening 29, which encloses the substrate 18. Arranged on the substrate 18 is the mixer 14, which is connected to the antenna element 16, 17 of the antenna 19. As explained earlier, the mixer 14 down-converts, respectively up-converts, signals received by the antenna 19 and signals to be transmitted by the antenna 19. In addition to this, as explained above, signals may be further processed with the aid of an analog signal processor which is not explicitly depicted in FIG. 4 and FIG. 5.

Evident from FIG. 5 is that the absorber 20 surrounds the substrate 18 on both sides in order to reduce the reflections towards the device under test.

Instead of forming the antenna 19 as depicted here, it is also possible to use two tapered slot line antennas on substrates, which are arranged orthogonally. In this case, a dual linear polarization measurement can be provided. The signals of these two antennas can be handled separately or can be combined.

Also advantageously, a power sensor can be integrated into the analog signal processor. A power measurement of signals received from the device under test can then be performed there. The power measurement in this case would be performed under a frequency reduced first measuring signal. In this case, a load resistor of the power sensor of the antenna has a higher value than 50 Ohm.

As a power sensor, a diode sensor produced in slot line technology can be used.

In addition, a rectification and/or a bandwidth limitation and/or an analog-digital-conversion can also be integrated into the analog signal processor. Furthermore, in addition to the mixer 14, the analog signal processor can moreover be adapted to provide an intermediate frequency signal or a baseband signal to the second connector 33.

Advantageously, the over the air measurement module 1 is adapted to perform a wireless measurement. This means that at least one of the connectors 31 and 33 can be implemented as a wireless interface for wirelessly transmitting the local oscillator signal provided by the local oscillator 32, respectively the measuring results to the measuring device 2.

Especially, it is possible to split the measuring system 30 into an antenna module and a detector module. The antenna module would then comprise all aspects presently contained in the over the air measurement module, while the detector module would comprise at least a detector for determining certain aspects of the measured signal, for example the power of the signal. Moreover, a sensor/processing module could be separately constructed. In this case, the over the air measurement module 1 could be split into an antenna module only comprising the antenna 19 in combination with the mixer 14 and a processing module comprising the analog signal processor 35. Alternatively, the over the air measurement module 1 could be split into an antenna module only comprising the antenna 19 and a processing module comprising the analog signal processor 35 in combination with the mixer 14. The antenna module, processing module and detector module can be integrated into a single module or housing. Also they can be separately constructed. Especially, an integration of the detector module and the antenna module is possible.

In order to connect the different modules, especially the sensor module, the antenna module, the detector module and the processing module, electrical conductors, for example coplanar transmission lines can be used. Also the use of optical transmission lines is possible.

In order to minimize noise, a chopper can be integrated into the detector module. By repeatedly reversing the polarity of the measured signal, the influence of noise can be mitigated. Especially, the influence of accidently coupling noise signals can be reduced.

Advantageously, the detector can be formed based on a coplanar transmission line. This allows for an easy transmission of the detected power to further components.

Advantageously, the antenna signals, especially if the antenna is a slot line antenna, can be converted to a signal on a coplanar transmission line so that they can be more easily handled on the circuit board and supplied to the further components.

The change of the transmission typology from slot line to coplanar can be performed either between the antenna and the analog signal processor or between the analog signal processor and the connector.

Figure 6:
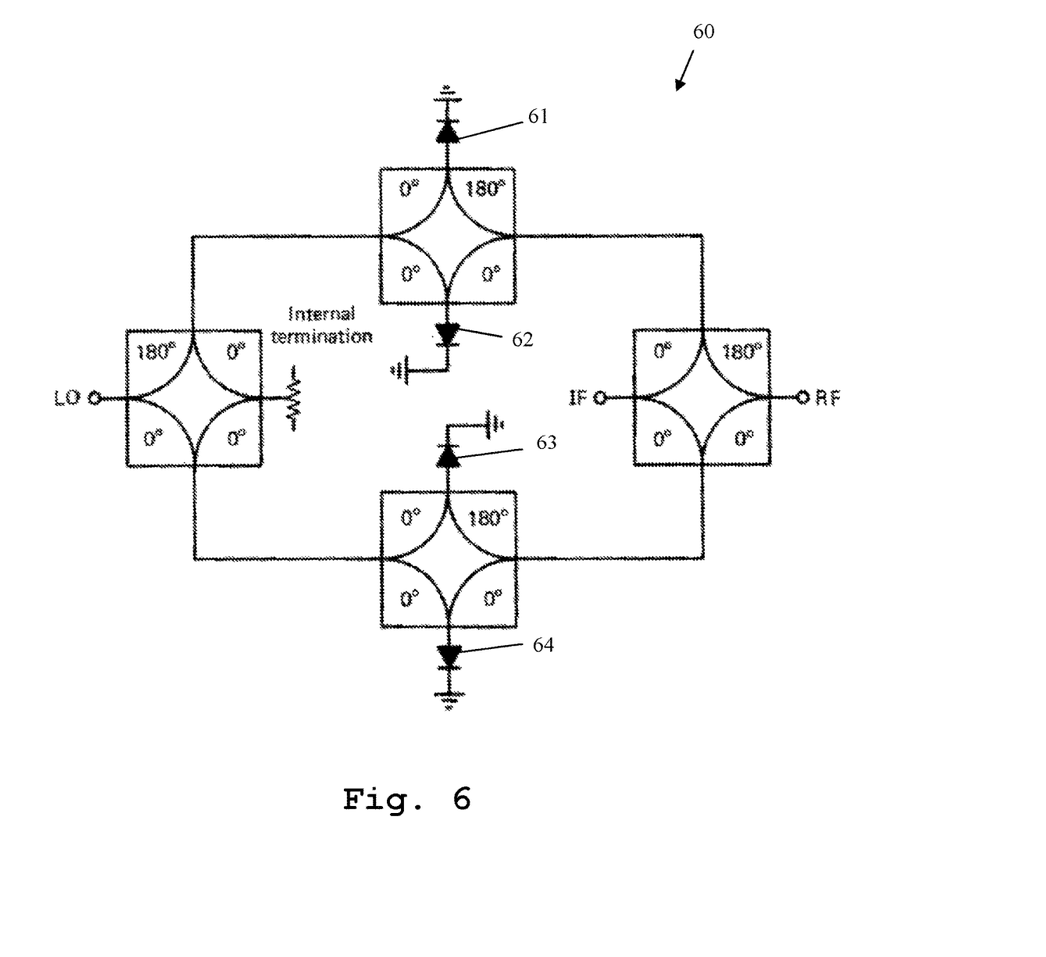
FIG. 6 shows an exemplary embodiment of a mixer employed for the over the air measurement module.

Now, with respect to FIG. 6, an exemplary embodiment of the mixer 14 is shown. FIG. 6, which originates from page 288 of "Ulrich L. Rohde: Microwave and Wireless Synthesizers—Theory and Design, 1997", illustrates a so-called termination-insensitive mixer 60.

The mixer 60 comprises four diodes 61, 62, 63, and 64. Said mixer 60 further provides four ports for a local oscillator (LO) signal, internal termination, an intermediate frequency (IF) signal, and a radio frequency (RF) signal.

Figure 7:
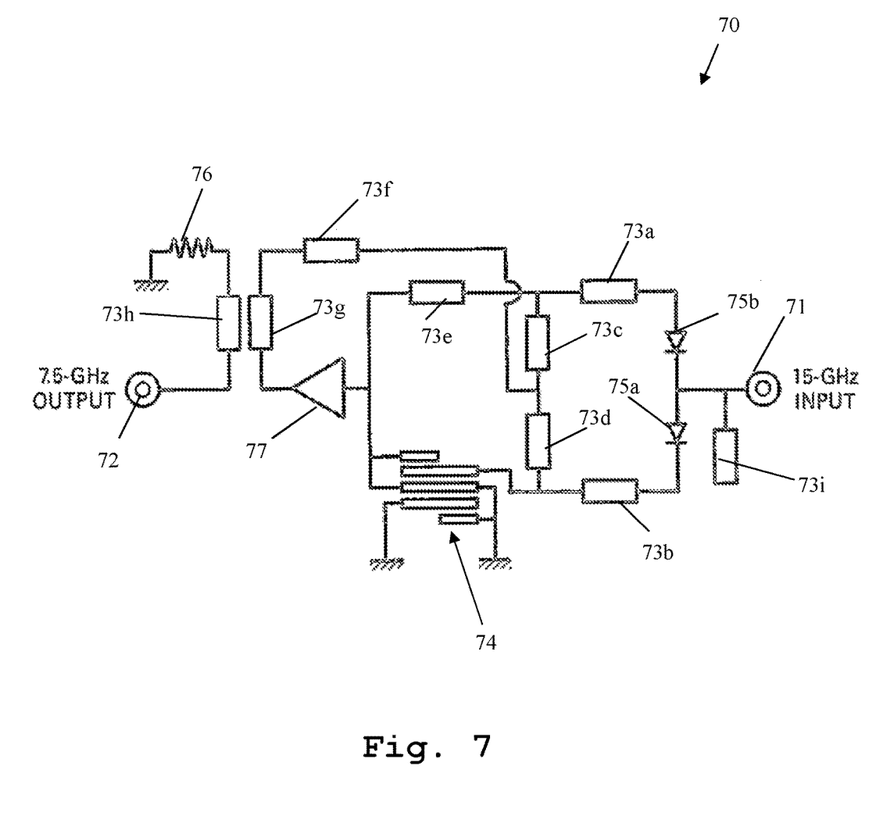
FIG. 7 shows an exemplary embodiment of a monolithic microwave integrated circuit frequency divider employed for the over the air measurement module.

Finally, with respect to FIG. 7, which originates from page 626 of above-mentioned "Ulrich L. Rohde: Microwave and Wireless Synthesizers—Theory and Design, 1997", a frequency divider 70 based on monolithic microwave integrated circuit MMIC technology is shown. Said frequency divider 70 can be used for dividing the frequency of the local oscillator signal by a factor as already mentioned with respect to FIG. 1 above.

The frequency divider 70 comprises an input port 71 and an output port 72. Furthermore, the frequency divider comprises a plurality of striplines 73*a* to 73*h*, wherein at least two 73*g* and 73*h* of them are capacitively and/or inductively coupled. In addition to this, the frequency divider 70 comprises at least one coupled resonator 74, preferably based on a finger structure, at least one resistor 76, at least one amplifier 77, and at least two diodes 75*a* and 75*b*.

The invention is not limited to the examples and especially not to a specific measurement direction. Also the measured signals are not limited to a specific communications task. The characteristics of the exemplary embodiments can be used and can be combined in any advantageous combination.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An over the air measurement module, comprising:
an antenna, adapted to receive a first measuring signal from a device under test or adapted to transmit a second measuring signal to the device under test,
a mixer, directly connected to said antenna, adapted to reduce or increase a frequency of the received first measuring signal, resulting in a frequency reduced or increased first measuring signal, or adapted to increase or reduce a frequency of a frequency reduced or increased second measuring signal, resulting in the second measuring signal, and
a first connector, connected to said mixer, adapted to input a local oscillator signal into the mixer for frequency conversion,
wherein at least 50% of the surfaces of the over the air measurement module facing the main radiation direction of the antenna are angled away from a normal of the main radiation direction of the antenna by at least 30°,
wherein the antenna is a planar antenna, and
wherein a main radiation direction of the antenna is in the plane of the planar antenna.

2. The over the air measurement module according to claim 1,
wherein the over the air measurement module further comprises a second connector, connected to the mixer, adapted to output the frequency reduced or increased first measuring signal or a corresponding intermediate frequency signal.

3. The over the air measurement module according to claim 1,
wherein the mixer is based on monolithic microwave integrated circuit technology, or
wherein the mixer is a harmonic mixer or a mixer comprising a multiplier for the local oscillator signal.

4. The over the air measurement module according to claim 1,
wherein a frequency of the local oscillator signal is divided by a factor before inputting the local oscillator signal into the mixer.

5. The over the air measurement module according to claim 1,
wherein the over the air measurement module is mounted within a shielded box.

6. The over the air measurement module according to claim 2,
wherein at least one of a frequency of the local oscillator signal and a frequency of the intermediate frequency signal is within a frequency range from 1 GHz to 10 GHz.

7. The over the air measurement module according to claim 1,
wherein the over the air measurement module further comprises a power sensor, adapted to measure at least one of the power of the frequency reduced or increased first measuring signal or the power of the second measuring signal.

8. The over the air measurement module according to claim 1,
wherein at least some surfaces of the over the air measuring module facing in the main radiation direction of the antenna are adapted to absorb electromagnetic radiation and not reflect electromagnetic radiation.

9. The over the air measurement module according to claim 1,
wherein at least some surfaces of the over the air measuring module facing in the main radiation direction of the antenna are coated with a paint absorbing electromagnetic radiation or covered with absorber material absorbing electromagnetic radiation or fabricated from absorber material absorbing electromagnetic radiation.

10. The over the air measurement module according to claim 1,
wherein over the air measurement module is tapered towards the main radiation direction of the antenna.

11. The over the air measurement module according to claim 2,
wherein at least one of the first connector or the second connector is a coaxial connector allowing to output the intermediate frequency signal to external units or to input a user-defined external local oscillator signal.

12. The over the air measurement module according to claim 1,
wherein a relative power loss for mixing is less than 10 percent, preferably less than 5 percent, most preferably less than 1 percent.

13. The over the air measurement module according to claim 1,
wherein over the air measurement module comprises a substrate, advantageously a printed circuit board,
wherein the antenna and the mixer are arranged on the substrate,
wherein the antenna is planar with the substrate, and
wherein the main radiation direction of the antenna is towards an edge of the substrate.

14. The over the air measurement module according to claim 1,
wherein the mixer is ring mixer, or
wherein the mixer comprises at least four diodes.

15. The over the air measurement module according to claim 13,
wherein the antenna is a tapered slotline antenna, preferably a Vivaldi antenna.

16. The over the air measurement module according to claim 15,
wherein the substrate comprises an opening between conductors of the tapered slotline antenna, or
wherein a substrate bridge connects opposite parts of the tapered slotline antenna in an area of an antenna aperture.

17. Measuring system comprising an over the air measurement module according to claim 1 and a measuring device,
wherein the measuring device is adapted to receive and measure the frequency reduc first measuring signal from the over the air measurement module or is adapted to provide t frequency reduced second measuring signal to the over the air measurement module.

* * * * *

UNITED STATES PATENT AND TRADEMARK OFFICE
CERTIFICATE OF CORRECTION

PATENT NO. : 10,193,639 B2  
APPLICATION NO. : 15/296407  
DATED : January 29, 2019  
INVENTOR(S) : Werner Perndl et al.

Page 1 of 1

It is certified that error appears in the above-identified patent and that said Letters Patent is hereby corrected as shown below:

On the Title Page

Item (63): the Related U.S. Application Data information is missing which should read: "Continuation-in-Part of Application No. 15/175,197, filed on June 7, 2016, now Pat. No. 10,200,135."

Signed and Sealed this  
Twelfth Day of March, 2019

Andrei Iancu  
*Director of the United States Patent and Trademark Office*